United States Patent
Chang et al.

(10) Patent No.: US 11,239,082 B2
(45) Date of Patent: Feb. 1, 2022

(54) METHOD FOR FABRICATING SEMICONDUCTOR DEVICE

(71) Applicant: UNITED MICROELECTRONICS CORP., Hsin-Chu (TW)

(72) Inventors: I-Fan Chang, Hsinchu (TW); Yen-Liang Wu, Taipei (TW); Wen-Tsung Chang, Tainan (TW); Jui-Ming Yang, Taichung (TW); Jie-Ning Yang, Pingtung County (TW); Chi-Ju Lee, Tainan (TW); Chun-Ting Chiang, Kaohsiung (TW); Bo-Yu Su, Tainan (TW); Chih-Wei Lin, Kaohsiung (TW); Dien-Yang Lu, Kaohsiung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 173 days.

(21) Appl. No.: 16/438,416

(22) Filed: Jun. 11, 2019

(65) Prior Publication Data
US 2019/0295849 A1 Sep. 26, 2019

Related U.S. Application Data

(62) Division of application No. 15/688,852, filed on Aug. 28, 2017, now Pat. No. 10,366,896.

(30) Foreign Application Priority Data

Aug. 2, 2017 (TW) .................................. 106125984

(51) Int. Cl.
*H01L 21/28* (2006.01)
*H01L 29/423* (2006.01)
(Continued)

(52) U.S. Cl.
CPC .. *H01L 21/28167* (2013.01); *H01L 29/42368* (2013.01); *H01L 29/6656* (2013.01);
(Continued)

(58) Field of Classification Search
CPC ......... H01L 21/28167; H01L 29/42368; H01L 29/6656
(Continued)

(56) References Cited

U.S. PATENT DOCUMENTS 4,868,617 A * 9/1989 Chiao ................. H01L 29/6656
257/344
4,994,873 A 2/1991 Madan
(Continued)

OTHER PUBLICATIONS

Hsu, Title of Invention: Semiconductor Device and Method for Fabricating the Same, U.S. Appl. No. 14/324,092, filed Jul. 4, 2014.

*Primary Examiner* — Ori Nadav
(74) *Attorney, Agent, or Firm* — Winston Hsu

(57) ABSTRACT

A method for fabricating semiconductor device includes the steps of first forming a gate dielectric layer on a substrate; forming a gate material layer on the gate dielectric layer, and removing part of the gate material layer and part of the gate dielectric layer to form a gate electrode, in which a top surface of the gate dielectric layer adjacent to two sides of the gate electrode is lower than a top surface of the gate dielectric layer between the gate electrode and the substrate. Next, a first mask layer is formed on the gate dielectric layer and the gate electrode, part of the first mask layer and part of the gate dielectric layer are removed to form a first spacer, a second mask layer is formed on the substrate and the gate electrode, and part of the second mask layer is removed to form a second spacer.

8 Claims, 3 Drawing Sheets

(51) Int. Cl.
*H01L 29/66* (2006.01)
*H01L 29/51* (2006.01)

(52) U.S. Cl.
CPC ...... *H01L 29/66545* (2013.01); *H01L 29/513* (2013.01); *H01L 29/517* (2013.01)

(58) Field of Classification Search
USPC ........................................................ 257/288
See application file for complete search history.

(56) References Cited

U.S. PATENT DOCUMENTS

| | | | |
|---|---|---|---|
| 5,512,771 A * | 4/1996 | Hiroki | H01L 21/823857 257/369 |
| 5,789,778 A | 8/1998 | Murai | |
| 5,796,151 A | 8/1998 | Hsu | |
| 6,091,120 A | 7/2000 | Yeom | |
| 6,165,825 A | 12/2000 | Odake | |
| 6,225,661 B1 | 5/2001 | An | |
| 6,774,430 B2 | 8/2004 | Horiguchi | |
| 6,876,045 B2 | 4/2005 | Takagi | |
| 7,276,775 B2 | 10/2007 | Bertin | |
| 2006/0284271 A1 * | 12/2006 | Doyle | H01L 29/66628 257/410 |
| 2010/0112799 A1 * | 5/2010 | Jeong | H01L 29/42328 438/591 |
| 2011/0211394 A1 * | 9/2011 | Scheiper | H01L 29/788 365/185.18 |
| 2013/0130460 A1 | 5/2013 | Liao et al. | |
| 2015/0145006 A1 | 5/2015 | Tamura | |
| 2015/0179748 A1 * | 6/2015 | Chang | H01L 27/1157 438/591 |
| 2015/0206874 A1 | 7/2015 | Son | |

\* cited by examiner

METHOD FOR FABRICATING SEMICONDUCTOR DEVICE

CROSS REFERENCE TO RELATED APPLICATIONS

This application is a division of U.S. application Ser. No. 15/688,852 filed Aug. 28, 2017, and incorporated herein by reference in its entirety.

BACKGROUND OF THE INVENTION

1. Field of the Invention

The invention relates to a method for fabricating semiconductor device, and more particularly to a method for fabricating gate dielectric layer having a reverse T-shape.

2. Description of the Prior Art

In current semiconductor industry, polysilicon has been widely used as a gap-filling material for fabricating gate electrode of metal-oxide-semiconductor (MOS) transistors. However, the conventional polysilicon gate also faced problems such as inferior performance due to boron penetration and unavoidable depletion effect which increases equivalent thickness of gate dielectric layer, reduces gate capacitance, and worsens driving force of the devices. In replacing polysilicon gates, work function metals have been developed to serve as a control electrode working in conjunction with high-K gate dielectric layers.

However, in current fabrication of high-k metal transistor, particularly during the stage when spacer is formed on the sidewall of gate structure, issues such as over-etching or undercut often arise and causing etching gas to etch through spacer until reaching the bottom of the gate structure. This induces erosion in high-k dielectric layer and/or bottom barrier metal (BBM) and affects the performance of the device substantially. Hence, how to resolve this issue has become an important task in this field.

SUMMARY OF THE INVENTION

According to an embodiment of the present invention, a method for fabricating semiconductor device includes the steps of first forming agate dielectric layer on a substrate; forming a gate material layer on the gate dielectric layer, and removing part of the gate material layer and part of the gate dielectric layer to form a gate electrode, in which a top surface of the gate dielectric layer adjacent to two sides of the gate electrode is lower than a top surface of the gate dielectric layer between the gate electrode and the substrate. Next, a first mask layer is formed on the gate dielectric layer and the gate electrode, part of the first mask layer and part of the gate dielectric layer are removed to form a first spacer, a second mask layer is formed on the substrate and the gate electrode, and part of the second mask layer is removed to form a second spacer.

According to another aspect of the present invention, a semiconductor device includes: a gate electrode on a substrate; a gate dielectric layer between the gate dielectric layer and the substrate, in which the gate dielectric layer comprises a top portion and a bottom portion and a width of the top portion is less than a width of the bottom portion; a first spacer on the bottom portion; and a second spacer adjacent to the first spacer.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
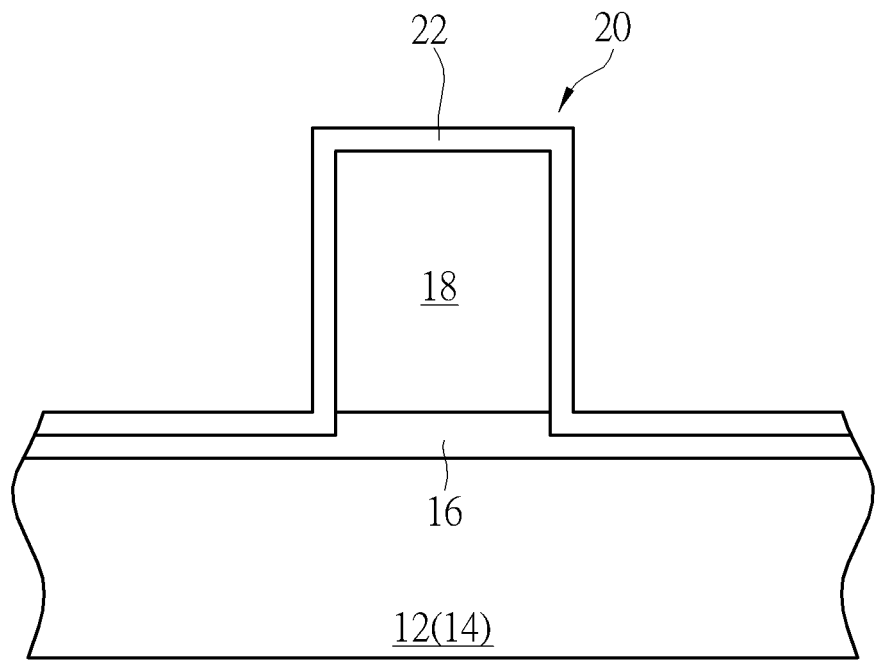
FIGS. 1-6 illustrate a method for fabricating a semiconductor device according to an embodiment of the present invention.

Referring to FIGS. 1-6, FIGS. 1-6 illustrate a method for fabricating a semiconductor device according to an embodiment of the present invention. As shown in FIG. 1, a substrate 12, such as a silicon substrate or silicon-on-insulator (SOI) substrate is first provided, and at least a transistor region such as a NMOS region or a PMOS region are defined on the substrate 12. Next, at least a fin-shaped structure 14 is formed on the substrate 12, in which the bottom of the fin-shaped structure 14 is surrounded by an insulating layer or shallow trench isolation (STI) made of material including but not limited to for example silicon oxide. It should be noted that even though this embodiment pertains to the fabrication of a non-planar FET device such as FinFET device, it would also be desirable to apply the following processes to a planar FET device, which is also within the scope of the present invention.

According to an embodiment of the present invention, the fin-shaped structure 14 could be obtained by a sidewall image transfer (SIT) process. For instance, a layout pattern is first input into a computer system and is modified through suitable calculation. The modified layout is then defined in a mask and further transferred to a layer of sacrificial layer on a substrate through a photolithographic and an etching process. In this way, several sacrificial layers distributed with a same spacing and of a same width are formed on a substrate. Each of the sacrificial layers may be stripe-shaped. Subsequently, a deposition process and an etching process are carried out such that spacers are formed on the sidewalls of the patterned sacrificial layers. In a next step, sacrificial layers can be removed completely by performing an etching process. Through the etching process, the pattern defined by the spacers can be transferred into the substrate underneath, and through additional fin cut processes, desirable pattern structures, such as stripe patterned fin-shaped structures could be obtained.

Alternatively, the fin-shaped structure 14 could also be obtained by first forming a patterned mask (not shown) on the substrate, 12, and through an etching process, the pattern of the patterned mask is transferred to the substrate 12 to form the fin-shaped structure. Moreover, the formation of the fin-shaped structure could also be accomplished by first forming a patterned hard mask (not shown) on the substrate 12, and a semiconductor layer composed of silicon germanium is grown from the substrate 12 through exposed patterned hard mask via selective epitaxial growth process to form the corresponding fin-shaped structure. These approaches for forming fin-shaped structure are all within the scope of the present invention.

Next, at least a gate structure or dummy gate is formed on the substrate 12. In this embodiment, the formation of the gate structure could be accomplished by a gate first process, a high-k first approach from gate last process, or a high-k last approach from gate last process. Since this embodiment pertains to a high-k last approach, a gate dielectric layer 16 or interfacial layer, a gate material layer 18 made of polysilicon, and a selective hard mask could be formed sequentially on the substrate 12, and a pattern transfer process is then conducted by using a patterned resist (not shown) as mask to remove part of the gate material layer 18 and part of the gate dielectric layer 16 through single or multiple etching processes. After stripping the patterned resist, a gate electrode 20 or gate structure composed of patterned gate dielectric layer 16 and patterned gate material layer 18 is formed on the substrate 12.

It should be noted that when part of the gate material layer 18 is removed by etching process to form the gate electrode 20, only part of the gate dielectric layer 16 adjacent to two sides of the gate electrode 20 is removed instead of removing all of the gate dielectric layer 16 adjacent to two sides of the gate electrode 20 to expose the surface of the fin-shaped structure 14. In other words, part of the gate dielectric layer 16 is still disposed on the surface of the fin-shaped structure 14 adjacent to two sides of the gate electrode 20 after the patterned gate material layer 18 or gate electrode 20 is formed, in which the gate dielectric layer 16 preferably includes two different thicknesses. Viewing from a more detailed perspective, the thickness of the gate dielectric layer 16 adjacent to two sides of the gate electrode 20 is slightly less than the thickness of the gate dielectric layer 16 between the gate electrode layer 20 and fin-shaped structure 14, or the top surface of the gate dielectric layer 16 adjacent to two sides of the gate electrode 20 is slightly lower than the top surface of the gate dielectric layer 16 between the gate electrode 20 and fin-shaped structure 14.

Next, a first mask layer 22 is formed on the gate dielectric layer 16 and the gate electrode 20. In this embodiment, the first mask layer 22 is preferably made of low-k dielectric material including but not limited to for example silicon oxycarbonitride (SiOCN).

Figure 2:
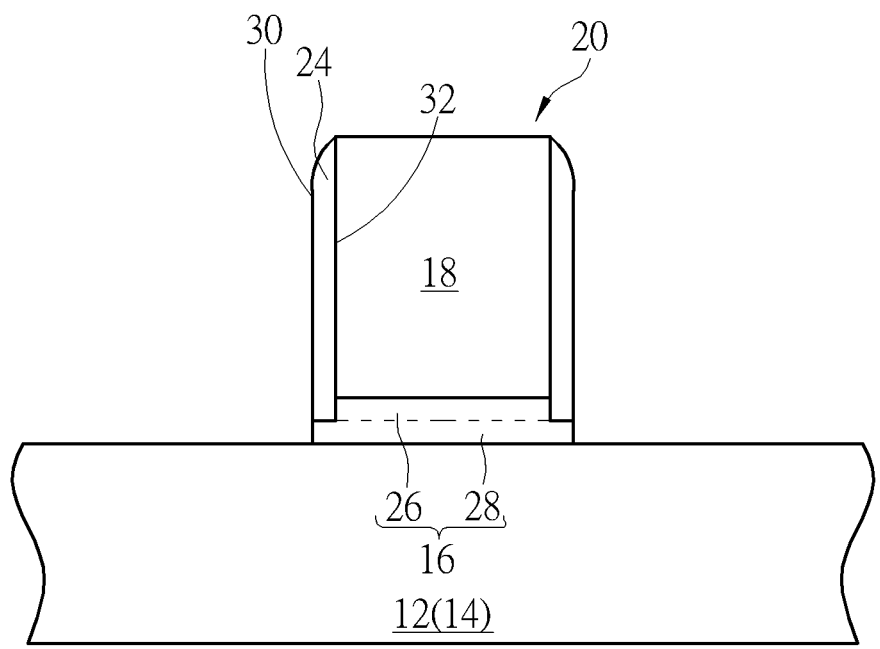

Next, as shown in FIG. 2, an etching process is conducted to remove part of the first mask layer 22 and part of the gate dielectric layer 16 to form a first spacer 24 adjacent to two sides of the gate electrode 20. Specifically, the formation of the first spacer 24 at this stage is accomplished by using the etching process to remove part of the first mask layer 22 on the top surface of the gate electrode 20, part of the first mask layer 22 adjacent to two sides of the gate electrode 20, and part of the remaining gate dielectric layer 16 adjacent to two sides of the gate electrode 20. This divides the gate dielectric layer 16 into two portions including a top portion 26 and a bottom portion 28, in which the top portion 26 and the bottom portion 28 together constitute a reverse T-shape. Preferably, the width of the top portion 26 is less than the width of the bottom portion 28, an outer sidewall 30 of the first spacer 24 is aligned with an edge of the bottom portion 28, and an inner sidewall 32 of the first spacer 24 is aligned with an edge of the top portion 26.

Figure 3:
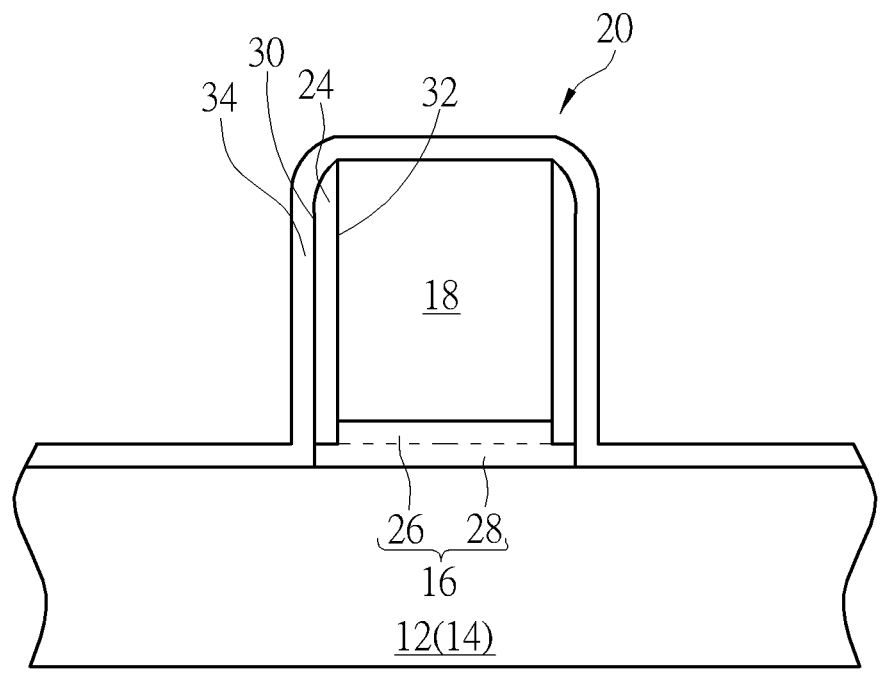

Next, as shown in FIG. 3, a second mask layer 34 is formed on the substrate 12 and the gate electrode 20. In this embodiment, the second mask 34 is preferably made of the silicon nitride, but not limited thereto.

Figure 4:
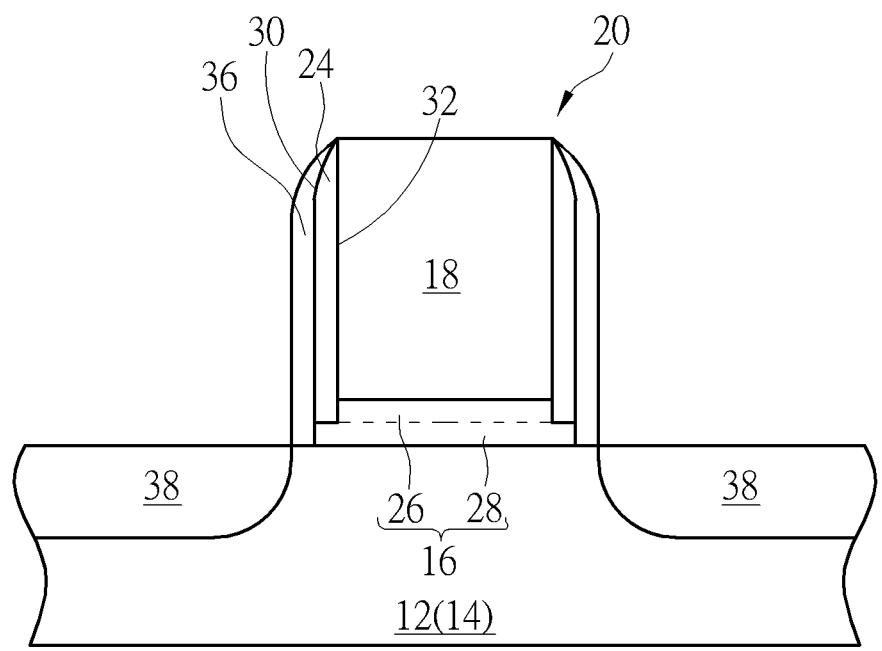

Next, as shown in FIG. 4, another etching process is conducted to remove part of the second mask layer 34 for forming a second spacer 36. Specifically, the formation of the second spacer 36 at this stage is accomplished by using the etching process to remove part of the second mask layer 34 on top of the gate electrode 20 and part of the second mask layer 34 adjacent to two sides of the gate electrode 20 to form a second spacer 36 adjacent to the first spacer 24.

Next, a source/drain region 38 and/or epitaxial layer (not shown) is formed in the fin-shaped structure 14 adjacent to two sides of the second spacer 36 and a silicide layer (not shown) could also be selectively formed on the surface of the source/drain region 38 and/or epitaxial layer. In this embodiment, the first spacer 24 and the second spacer 36 are preferably made of different material such as the first spacer 24 preferably includes SiOCN while the second spacer 36 includes SiN. Nevertheless, the first spacer 24 and the second spacer 36 could also be made of same material or different material depending on the demand of the process while both spacers 24 and 36 could be selected from the group consisting of $SiO_2$, SiN, SiON, and SiCN. The source/drain region 38 could include dopants and epitaxial material of different conductive type depending on the type of device being fabricated. For example, the source/drain region 38 on a NMOS region could include SiC or SiP while the source/drain region 38 on a PMOS region could include SiGe, but not limited thereto.

Figure 5:
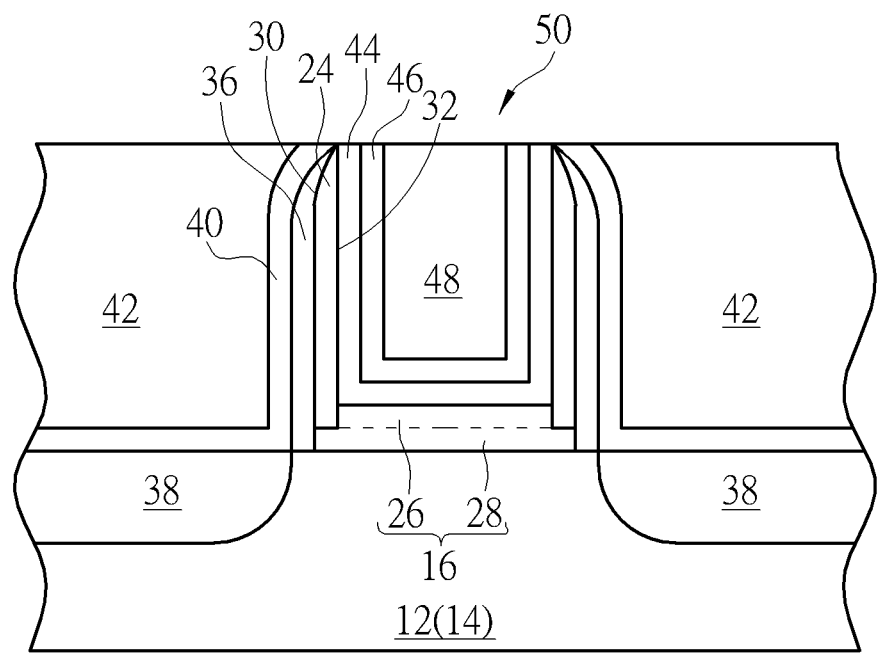

Next, as shown in FIG. 5, a contact etch stop layer (CESL) 40 is formed on the surface of the fin-shaped structures 14 and covering the first spacer 24 and the gate electrode 20, and an interlayer dielectric (ILD) layer 42 is formed on the CESL 40. Next, a planarizing process such as chemical mechanical polishing (CMP) process is conducted to remove part of the ILD layer 42 and part of the CESL 40 for exposing the gate material layer 18 made of polysilicon, in which the top surface of the gate material layer 18 is even with the top surface of the ILD layer 42.

Next, a replacement metal gate (RMG) process is conducted to transform the gate electrode 20 into a metal gate. For instance, the RMG process could be accomplished by first performing a selective dry etching or wet etching process using etchants including but not limited to for example ammonium hydroxide ($NH_4OH$) or tetramethylammonium hydroxide (TMAH) to remove the gate material layer 18 for forming a recess (not shown) in the ILD layer 42. Next, a high-k dielectric layer 44, a work function metal layer 46, and a low resistance metal layer 48 are formed in the recess, and a planarizing process such as CMP is conducted to remove part of low resistance metal layer 48, part of work function metal layer 46, and part of high-k dielectric layer 44 to form metal gate 50.

Figure 6:
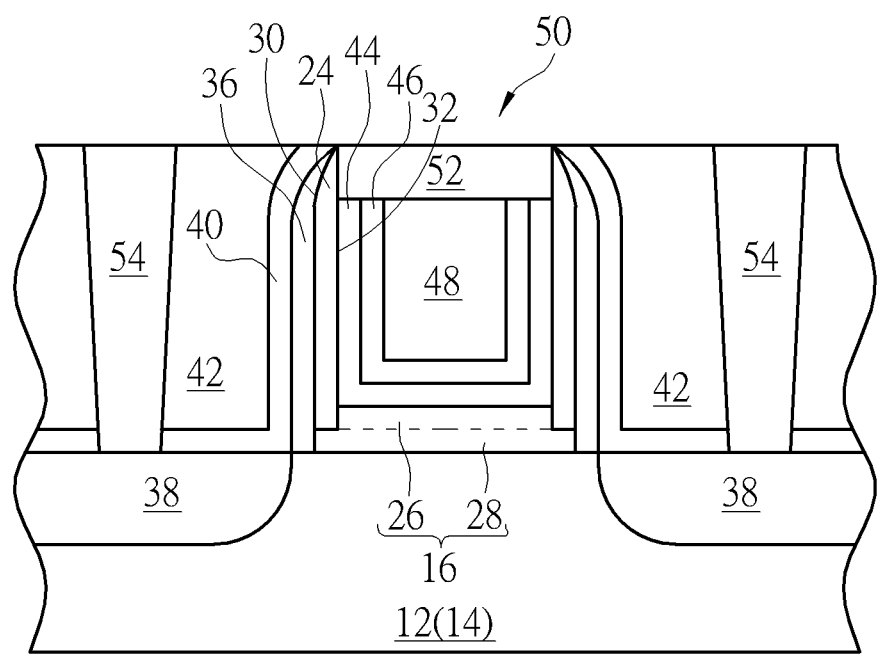

Next, as shown in FIG. 6, part of the low resistance metal layer 48, part of the work function metal layer 46, and part of the high-k dielectric layer 44 are removed to form another recess (not shown), and a hard mask 52 made of dielectric material including but not limited to for example silicon nitride is deposited into the recess so that the top surfaces of the hard mask 52 and ILD layer 42 are coplanar. In this embodiment, the gate structure or metal gate 50 fabricated through high-k last process of a gate last process preferably includes an interfacial layer or gate dielectric layer 16, a U-shaped high-k dielectric layer 44, a U-shaped work function metal layer 46, and a low resistance metal layer 48.

In this embodiment, the high-k dielectric layer 44 is preferably selected from dielectric materials having dielectric constant (k value) larger than 4. For instance, the high-k dielectric layer 44 may be selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate (SrBi$_2$Ta$_2$O$_9$, SBT), lead zirconate titanate (PbZr$_x$Ti$_{1-x}$O$_3$, PZT), barium strontium titanate (Ba$_x$Sr$_{1-x}$TiO$_3$, BST) or a combination thereof.

In this embodiment, the work function metal layer 46 is formed for tuning the work function of the metal gate in accordance with the conductivity of the device. For an NMOS transistor, the work function metal layer 46 having a work function ranging between 3.9 eV and 4.3 eV may include titanium aluminide (TiAl), zirconium aluminide (ZrAl), tungsten aluminide (WAl), tantalum aluminide (TaAl), hafnium aluminide (HfAl), or titanium aluminum carbide (TiAlC), but it is not limited thereto. For a PMOS transistor, the work function metal layer 46 having a work function ranging between 4.8 eV and 5.2 eV may include titanium nitride (TiN), tantalum nitride (TaN), tantalum carbide (TaC), but it is not limited thereto. An optional barrier layer (not shown) could be formed between the work function metal layer 46 and the low resistance metal layer 48, in which the material of the barrier layer may include titanium (Ti), titanium nitride (TiN), tantalum (Ta) or tantalum nitride (TaN). Furthermore, the material of the low-resistance metal layer 48 may include copper (Cu), aluminum (Al), titanium aluminum (TiAl), cobalt tungsten phosphide (CoWP) or any combination thereof.

Next, a photo-etching process is conducted by using a patterned mask (not shown) as mask to remove part of the ILD layer 42 adjacent to the metal gate 50 for forming contact holes (not shown) exposing the source/drain region 38 underneath. Next, metals including a barrier layer selected from the group consisting of Ti, TiN, Ta, and TaN and a low resistance metal layer selected from the group consisting of W, Cu, Al, TiAl, and CoWP are deposited into the contact holes, and a planarizing process such as CMP is conducted to remove part of aforementioned barrier layer and low resistance metal layer for forming contact plugs 54 electrically connecting the source/drain region 38. This completes the fabrication of a semiconductor device according to a preferred embodiment of the present invention.

Referring again to FIG. 6, which further illustrates a structural view of a semiconductor device according to an embodiment of the present invention. As shown in FIG. 6, the semiconductor device preferably includes a gate electrode metal gate 50 disposed on the substrate 12, a gate dielectric layer 16 disposed between the metal gate 50 and the substrate 12, a first spacer 24 adjacent to the sidewalls of the metal gate 50, and a second spacer 36 adjacent to the first spacer 24. Viewing from a more detailed perspective, the gate dielectric layer 16 further includes a top portion 26 and a bottom portion 28, in which the width of the top portion 26 is less than the width of the bottom portion 28. Preferably, the first spacer 24 directly contacts the top portion 26 and the bottom portion 28 at the same time, the outer sidewall 30 of the first spacer 24 is aligned with an edge of the bottom portion 28, and the inner sidewall 32 of the first spacer 24 is aligned with an edge of the top portion 26.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating semiconductor device, comprising:
    forming a gate dielectric layer on a substrate;
    forming a gate material layer on the gate dielectric layer;
    removing part of the gate material layer and part of the gate dielectric layer to form a gate electrode, wherein a top surface of the gate dielectric layer adjacent to two sides of the gate electrode is lower than a top surface of the gate dielectric layer between the gate electrode and the substrate;
    forming a first mask layer on and directly contacting the gate dielectric layer and the gate electrode;
    removing part of the first mask layer and part of the gate dielectric layer in one etching step to form a first spacer and divide the gate dielectric layer into a top portion and a bottom portion, wherein the first spacer directly contacts sidewalls of the gate electrode and a thickness of the top portion is equal to a thickness of the bottom portion;
    forming a second mask layer on the substrate and the gate electrode after forming the first spacer; and
    removing part of the second mask layer to form a second spacer, wherein a large portion of the first spacer and the second spacer are substantially parallel and vertically arranged, and the first spacer and the second spacer converge at a junction point between a top surface and a sidewall of the gate electrode.

2. The method of claim 1, wherein a width of the top portion is less than a width of the bottom portion.

3. The method of claim 2, wherein a width of the top portion is equal to a width of the gate electrode.

4. The method of claim 2, wherein an outer sidewall of the first spacer is aligned with an edge of the bottom portion.

5. The method of claim 2, wherein an inner sidewall of the first spacer is aligned with an edge of the top portion.

6. The method of claim 2, wherein the first spacer contacts the top portion and the bottom portion directly.

7. The method of claim 1, wherein the first spacer comprises SiOCN.

8. The method of claim 1, wherein the second spacer comprises SiN.

* * * * *